US009181619B2

(12) United States Patent
Li et al.

(10) Patent No.: US 9,181,619 B2
(45) Date of Patent: Nov. 10, 2015

(54) PHYSICAL VAPOR DEPOSITION WITH HEAT DIFFUSER

(75) Inventors: Youming Li, San Jose, CA (US); Jeffrey Birkmeyer, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 1062 days.

(21) Appl. No.: 12/714,422

(22) Filed: Feb. 26, 2010

(65) Prior Publication Data

US 2011/0209985 A1   Sep. 1, 2011

(51) Int. Cl.
| | |
|---|---|
| *C23C 14/34* | (2006.01) |
| *C23C 14/50* | (2006.01) |
| *C23C 14/54* | (2006.01) |
| *H01J 37/34* | (2006.01) |
| *H01J 37/32* | (2006.01) |

(52) U.S. Cl.
CPC ............. *C23C 14/50* (2013.01); *C23C 14/3407* (2013.01); *C23C 14/541* (2013.01); *H01J 37/32467* (2013.01); *H01J 37/32522* (2013.01); *H01J 37/32715* (2013.01); *H01J 37/32724* (2013.01); *H01J 37/34* (2013.01); *H01J 37/347* (2013.01); *H01J 37/3488* (2013.01)

(58) Field of Classification Search
CPC ..................... H01J 37/32467; H01J 37/32522; H01J 37/3488; C23C 14/541
USPC ............. 204/192.12, 192.13, 298.07, 298.09, 204/298.15, 298.08; 269/903
See application file for complete search history.

(56) References Cited

U.S. PATENT DOCUMENTS

| | | | |
|---|---|---|---|
| 4,599,069 A | 7/1986 | Murakami et al. | |
| 4,622,122 A | 11/1986 | Landau | |
| 5,108,570 A * | 4/1992 | Wang ......................... | 204/192.3 |
| 5,202,008 A | 4/1993 | Talieh et al. | |
| 5,234,561 A | 8/1993 | Randhawa et al. | |
| 5,673,167 A * | 9/1997 | Davenport et al. ........... | 361/234 |
| 5,736,021 A | 4/1998 | Ding et al. | |
| 6,132,550 A | 10/2000 | Shiomi | |
| 6,227,140 B1 | 5/2001 | Kennedy et al. | |
| 6,254,745 B1 * | 7/2001 | Vukovic ................... | 204/298.06 |
| 6,471,830 B1 | 10/2002 | Moslehi et al. | |
| 6,726,805 B2 | 4/2004 | Brown et al. | |

(Continued)

FOREIGN PATENT DOCUMENTS

| | | |
|---|---|---|
| EP | 0519608 A1 | 12/1992 |
| JP | 60180998 A | 9/1985 |

(Continued)

OTHER PUBLICATIONS

Partial English Translation of Notification of Reasons for Rejection from corresponding Japanese Application No. 2011-038894, mailed Jan. 28, 2014, 8 pages.

*Primary Examiner* — Jason M Berman
(74) *Attorney, Agent, or Firm* — Fish & Richardson P.C.

(57) ABSTRACT

A physical vapor deposition apparatus includes a vacuum chamber having side walls, a cathode inside the vacuum chamber, wherein the cathode is configured to include a sputtering target, a radio frequency power supply configured to apply power to the cathode, an anode inside and electrically connected to the side walls of the vacuum chamber, and a chuck inside and electrically isolated from the side walls of the vacuum chamber, the chuck configured to support a substrate, and a heater to heat the substrate supported on the chuck. The chuck includes a body and a graphite heat diffuser supported on the body and configured to contact the substrate.

20 Claims, 10 Drawing Sheets

(56) References Cited

U.S. PATENT DOCUMENTS

| | | |
|---|---|---|
| 7,368,041 B2 | 5/2008 | Krassnitzer |
| 7,382,661 B1 | 6/2008 | Lin |
| 7,601,224 B2 | 10/2009 | Foree |
| 2001/0037761 A1 | 11/2001 | Ries et al. |
| 2003/0116432 A1* | 6/2003 | Schweitzer et al. ..... 204/298.11 |
| 2004/0255843 A1 | 12/2004 | Yoshida et al. |
| 2006/0222481 A1 | 10/2006 | Foree |
| 2009/0236949 A1 | 9/2009 | Fujii et al. |
| 2010/0039481 A1* | 2/2010 | Fujii et al. ........................ 347/68 |
| 2010/0147680 A1 | 6/2010 | Li et al. |
| 2010/0147681 A1 | 6/2010 | Li et al. |

FOREIGN PATENT DOCUMENTS

| | | |
|---|---|---|
| JP | 07176482 | 7/1995 |
| JP | 2000-294547 | 10/2000 |
| JP | 2003229370 A | 8/2003 |
| JP | 2003532612 A | 11/2003 |
| JP | 2007-042818 | 2/2007 |
| JP | 2009231417 | 10/2009 |
| JP | 2009231471 A | 10/2009 |
| JP | 2010043330 | 2/2010 |
| KR | 10-2000-0051498 | 8/2000 |
| KR | 10-0779885 | 11/2007 |

* cited by examiner

PHYSICAL VAPOR DEPOSITION WITH HEAT DIFFUSER

TECHNICAL FIELD

The present disclosure relates generally to radio frequency (RF) sputtering physical vapor deposition (PVD).

BACKGROUND

Radio frequency sputtering PVD is a method for depositing a thin film on a substrate. The substrate is placed in a vacuum chamber facing a target that is connected to an RF power supply. When the RF power is initiated, a plasma is formed. Positive gas ions are pulled to the target surface, strike the target, and remove target atoms by momentum transfer. The removed target atoms then deposit on the substrate to form a thin film layer. During physical vapor deposition, it can be important to control the properties of the deposited thin film.

SUMMARY

In one aspect, a physical vapor deposition apparatus includes a vacuum chamber having side walls, a cathode inside the vacuum chamber, the cathode configured to include a sputtering target, a radio frequency power supply configured to apply power to the cathode, an anode inside and electrically connected to the side walls of the vacuum chamber, a chuck inside and electrically isolated from the side walls of the vacuum chamber, the chuck configured to support a substrate, a clamp configured to hold the substrate to the chuck, wherein the clamp is electrically conductive, and an insulator configured to electrically isolate the substrate from the clamp.

Implementations can include one or more of the following features. The insulator may be quartz or alumina ceramic. The insulator may be annular. The insulator may be about 1 mm to 2 mm thick. The target may be a dielectric material, e.g., lead zirconate titinate ("PZT"). An impedance matching network may be electrically connected to the chuck. A shield may be positioned inside and be electrically connected to the walls of the chamber, and the shield and the clamp may partially horizontally overlap. A conductive portion of the clamp may extends inwardly from a space near the shield towards the substrate.

In another aspect, a method of physical vapor deposition includes applying a radio frequency signal to a cathode in a physical vapor deposition apparatus, wherein the physical vapor deposition apparatus includes a vacuum chamber having side walls, the cathode inside the vacuum chamber and including a sputtering target, an anode inside and electrically connected to the side walls of the vacuum chamber, a chuck inside and electrically isolated from the side walls of the vacuum chamber, the chuck supporting a substrate, a clamp holding the substrate to the chuck, wherein the clamp is electrically conductive, and an insulator configured to electrically isolate the substrate from the clamp. Material is deposited from the sputtering target onto the substrate such that film having a substantially pure (111) crystalline structure is formed.

Implementations can include one or more of the following features. The chuck may be heated to between about 650° C. and 750° C. The radio frequency signal may have a radio frequency power having a magnitude of between about 1000 W and 5000 W, e.g., about 3000 W. The target may be a dielectric material, e.g., lead zirconate titinate ("PZT"). The film may have a thickness of between about 2000 Å and 10 µm, e.g., between about 2 µm and 4 µm.

In another aspect, a physical vapor deposition apparatus includes a vacuum chamber having side walls, a cathode inside the vacuum chamber, wherein the cathode is configured to include a sputtering target, a radio frequency power supply configured to apply power to the cathode, an anode inside and electrically connected to the side walls of the vacuum chamber, and a chuck inside and electrically isolated from the side walls of the vacuum chamber, the chuck configured to support a substrate, and a heater to heat the substrate supported on the chuck. The chuck includes a body and a graphite heat diffuser supported on the body and configured to contact the substrate.

Implementations can include one or more of the following features. The body may be a metal alloy. The heat diffuser may include a plurality of gas passages therethrough. Each of the passages may extend vertically through the heat diffuser. Each of the passages may be between about 100 and 1,000 µm in diameter, e.g., about 500 µm in diameter. The passages may have a spacing of about 10 to 15 mm. The heat diffuser may be between about 1 mm and 5 mm thick, e.g., about 2 mm thick. A top surface of the heat diffuser may be substantially planar. The heat diffuser may be configured such that a bottom surface of the substrate is substantially flush with the top surface of the heat diffuser. The target may be a dielectric material, e.g., lead zirconate titinate ("PZT"). An impedance matching network may be electrically connected to the chuck. The heater may be embedded in the body.

In another aspect, a method of physical vapor deposition includes applying a radio frequency signal to a cathode in a physical vapor deposition apparatus, the cathode including a sputtering target, supporting a substrate on a chuck, contacting the substrate to a graphite heat diffuser located between the chuck and the substrate while heating the substrate, and depositing a material from the sputtering target onto the substrate.

Implementations can include one or more of the following features. The gas may include argon or helium. A temperature across the substrate may vary by less than 10° C. The radio frequency signal may have a radio frequency power having a magnitude of between about 1000 W and 5000 W, e.g., about 3000 W. The target may be a dielectric material, e.g., lead zirconate titinate ("PZT"). The film may have a thickness of between about 2000 Å and 10 µm, e.g., between about 2 µm and 4 µm. Heating the substrate may include heating the substrate with a heater embedded in the chuck. Gas may flow through a plurality of passage in the graphite heat diffuser.

In another aspect, a physical vapor deposition apparatus includes a vacuum chamber having side walls, a cathode inside the vacuum chamber, wherein the cathode is configured to include a sputtering target, a radio frequency power supply configured to apply power to the cathode, an anode inside and electrically connected to the side walls of the vacuum chamber, a chuck inside and electrically isolated from the side walls of the vacuum chamber, the chuck configured to support a substrate, a clamp configured to hold the substrate to the chuck, wherein the clamp is electrically conductive, and a plurality of conductive electrodes attached to the clamp, each electrode configured to compress when contacted by the substrate.

Implementations can include one or more of the following features. Each of the electrodes may provides an electrical contact point between the clamp and the substrate. Springs may urge the electrodes against the substrate. The springs may be the electrodes. Each spring may be a flat spring. Each spring may have a first end attached to the clamp and a second end, and the second end of at least one of the springs may be configured to touch the clamp when the spring is compressed. Each spring may be a metal alloy having a substantially constant spring constant at temperatures between 300° C. and 600° C., e.g., each spring may be inconel X750. The plurality of electrodes may be uniformly spaced angularly around the clamp. There may be between 10 and 100 electrodes, e.g., 64 electrodes. The target may be a dielectric material, e.g., lead zirconate titinate ("PZT"). An impedance matching network may be electrically connected to the chuck.

In another aspect, a method of physical vapor deposition includes positioning a substrate on a chuck in a physical vapor deposition apparatus, the physical vapor deposition apparatus including a vacuum chamber having side walls, a cathode inside the vacuum chamber, wherein the cathode includes a sputtering target, an anode inside and electrically connected to the side walls of the vacuum chamber, a chuck inside and electrically isolated from the side walls of the vacuum chamber, the chuck supporting a substrate, a clamp holding substrate to the chuck, wherein the clamp is electrically conductive, and a plurality of conductive electrodes attached to the clamp, wherein the substrate is positioned on the chuck and in contact with each of the plurality of electrodes, the contact causing each of the plurality of electrodes to compress, applying a radio frequency signal to the cathode, and depositing material from the sputtering target onto the substrate such that film having a substantially pure (100) crystalline structure is formed.

Implementations can include one or more of the following features. The electrodes may be urged against the substrate with springs. The springs may be the electrodes. Each spring may have a first end attached to the clamp and a second end, and the second end of at least one of the springs may touch the clamp when the spring is compressed. Each spring may be a flat spring.

Each spring may compress by less than 0.5 mm. The chuck may be heated to between about 670° C. and 690° C. The radio frequency signal may have a radio frequency power having a magnitude of between about 1000 W and 5000 W, e.g., about 3000 W. The target may be a dielectric material, e.g., lead zirconate titinate ("PZT"). The film may have a thickness of between about 2000 Å and 10 µm, e.g., between about 2 µm and 4 µm.

Certain implementations of a physical vapor deposition apparatus may have one or more of the following advantages.

A graphite heat diffuser, especially a heat diffuser with a plurality of passages therethrough, can improve heat transfer between a heated chuck and a substrate supported on the chuck. Improved heat transfer can result in smaller variations in temperature across the substrate. More uniform temperature across the substrate can result in a deposited film on the substrate having more uniform physical characteristics.

An insulator that electrically isolates a substrate from a clamp can reduce or eliminate electric discharge between the clamp and the substrate. Reduction or elimination of the electric discharge can result in a deposited film on the substrate having more uniform physical characteristics. Further, using an insulator between the clamp and substrate can allow for the creation of a film having a substantially pure (111) crystalline structure (e.g. about 80% or more of a volume fraction has a (111) crystalline structure). A substantially pure (111) crystalline structure can have advantageous dielectric and piezoelectric properties, such as a high d33 coefficient (e.g. about 400 or more pm/V, such as about 500 pm/V) and high dielectric breakdown voltage (e.g. about 500 kV/cm or more).

A plurality of conductive springs attached to a clamp, each spring configured to compress when contacted by a substrate, can provide a plurality of electrical contact points between the clamp and the substrate. Having a plurality of electrical contact points can provide more uniform RF current distribution on the substrate and result in a more homogeneous deposited film, such as a film having a substantially pure (100) crystalline structure (e.g. about 80% or more of a volume fraction has a (111) crystalline structure). A substantially pure (100) crystalline structure can have advantageous dielectric and piezoelectric properties, such as a dielectric constant in the range of 1000 to 1700, a high d31 coefficient (e.g. about −200 pm/V or more, such as about −300 pm/V), and a high breakdown voltage (e.g. about 100 kV/cm or more, for example, about 200 kV/cm).

The details of one or more embodiments are set forth in the accompanying drawings and the description below. Other features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

When RF physical vapor deposition, or sputtering, is used to create a thin film on a substrate, temperature nonuniformity of the substrate and RF current distribution into the substrate from the clamp can cause the deposited film to be nonuniform. By adding a heat diffuser to the chuck, the temperature uniformity of the substrate can be improved. By including an insulator or a spring system between the chuck and the clamp, the RF current distribution in the substrate can be better controlled, and spikes in current that can cause defects in the deposited thin film can be reduced.

Figure 1A:
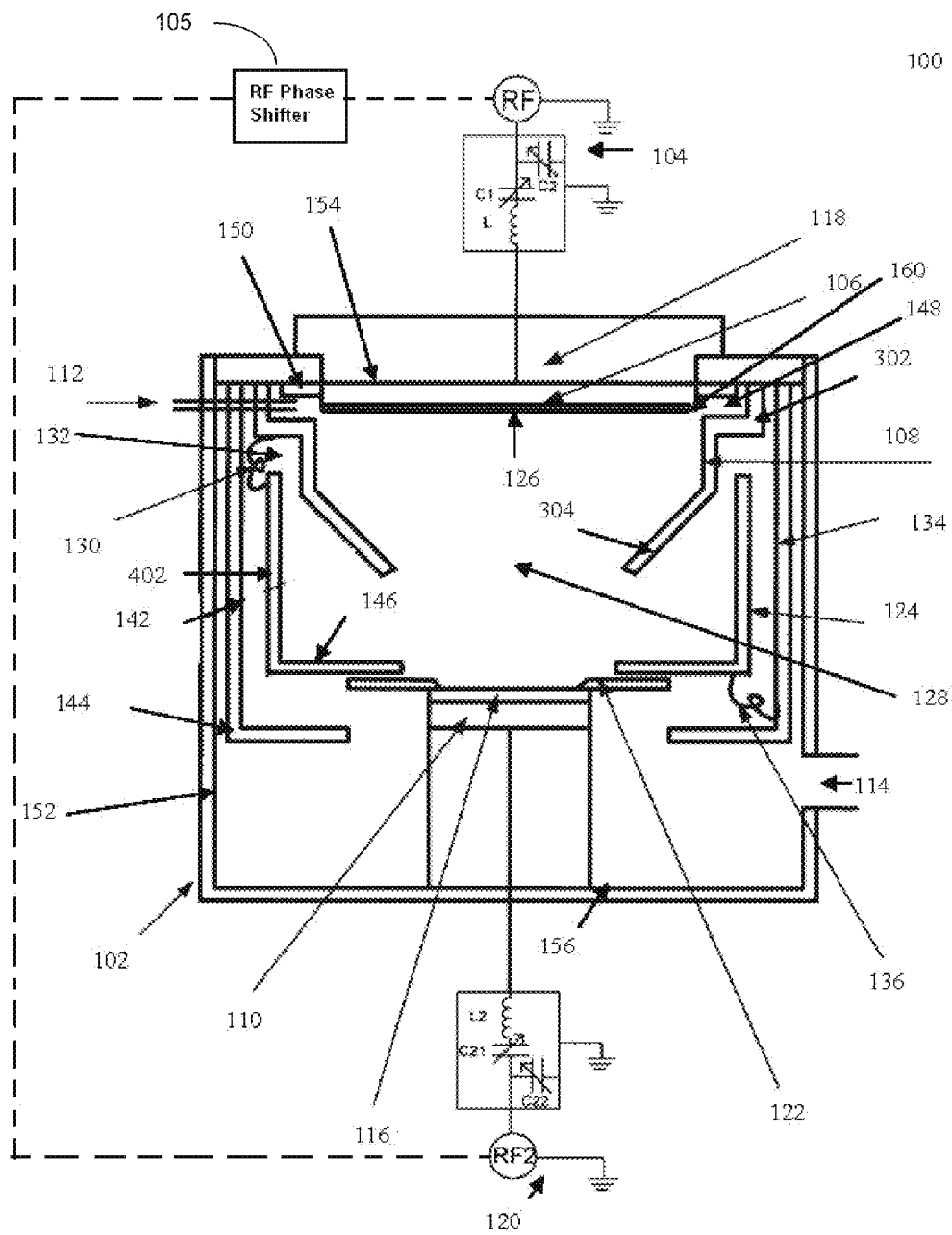
FIG. 1A is a schematic of a cross-section of an embodiment of a physical vapor deposition apparatus including an RF phase shifter and an extended anode.

Referring to FIG. 1A, a physical vapor deposition apparatus 100 can include a vacuum chamber 102. The vacuum chamber 102 can be cylindrical and have side walls 152, a top surface 154, and bottom surface 156. A magnetron assembly 118 can be located at the top of vacuum chamber 102. The magnetron assembly 118 can include a set of magnets having alternating magnetic poles. The magnetron assembly 118 can be stationary or can rotate about an axis perpendicular to a radius of vacuum chamber 102. The physical vapor deposition apparatus 100 can further include an RF power supply 104 and a corresponding load matching network, which can match the impedance of the power supply 104 to that of vacuum chamber 102.

A cathode assembly 106 can be housed inside and near the top surface 154 of vacuum chamber 102. Cathode assembly 106 can include a target 126 that can be bonded to a metallic backing plate (not shown). The target 126 can be generally circular, with an outer edge 160. The target can be made of, for example, a dielectric material such as lead zirconate titinate ("PZT"). Cathode 106 can act as an electrode for RF current when RF power is applied by RF power supply 104. Cathode assembly 106 can be electrically isolated from the vacuum chamber 102 by an insulator ring 150.

A substrate support or chuck 110 to support one or more substrates can be housed inside vacuum chamber 102 near, but spaced above, the bottom surface 156 of the vacuum chamber 102. A clamp 122 can be configured to hold a substrate 116 such that substrate 116 can be coated with a thin film during the PVD process. The substrate 116 can be, for example, a microelectromechanical system (MEMS) wafer. The clamp 122 can be formed of a conductive material, for example, stainless steel. In some implementations, the clamp 122 can extend inwardly from a space near the shield 124. The clamp 122 can vertically overlap with the substrate 116 by 1 mm to 10 mm, such as 4 mm. Further, the clamp 122 can be configured such that does not continuously touch the substrate 116, but rather has distinct points of contact, e.g. 10-100 points, with the substrate 116. The clamp can be electrically isolated from the side walls of the chamber and shield, e.g., have a floating potential.

In one embodiment, shown in FIG. 1A, the chuck 110 can be electrically isolated or floating from ground, and an RF power supply 120 can be electrically connected to chuck 110 (the RF power supply 120 can be connected to ground). An RF phase shifter 105 can be connected between RF power supply 120 and RF power supply 104. RF power supply 104 can serve as a phase reference to RF power supply 120 when phase shifter 105 is activated.

Figure 1B:
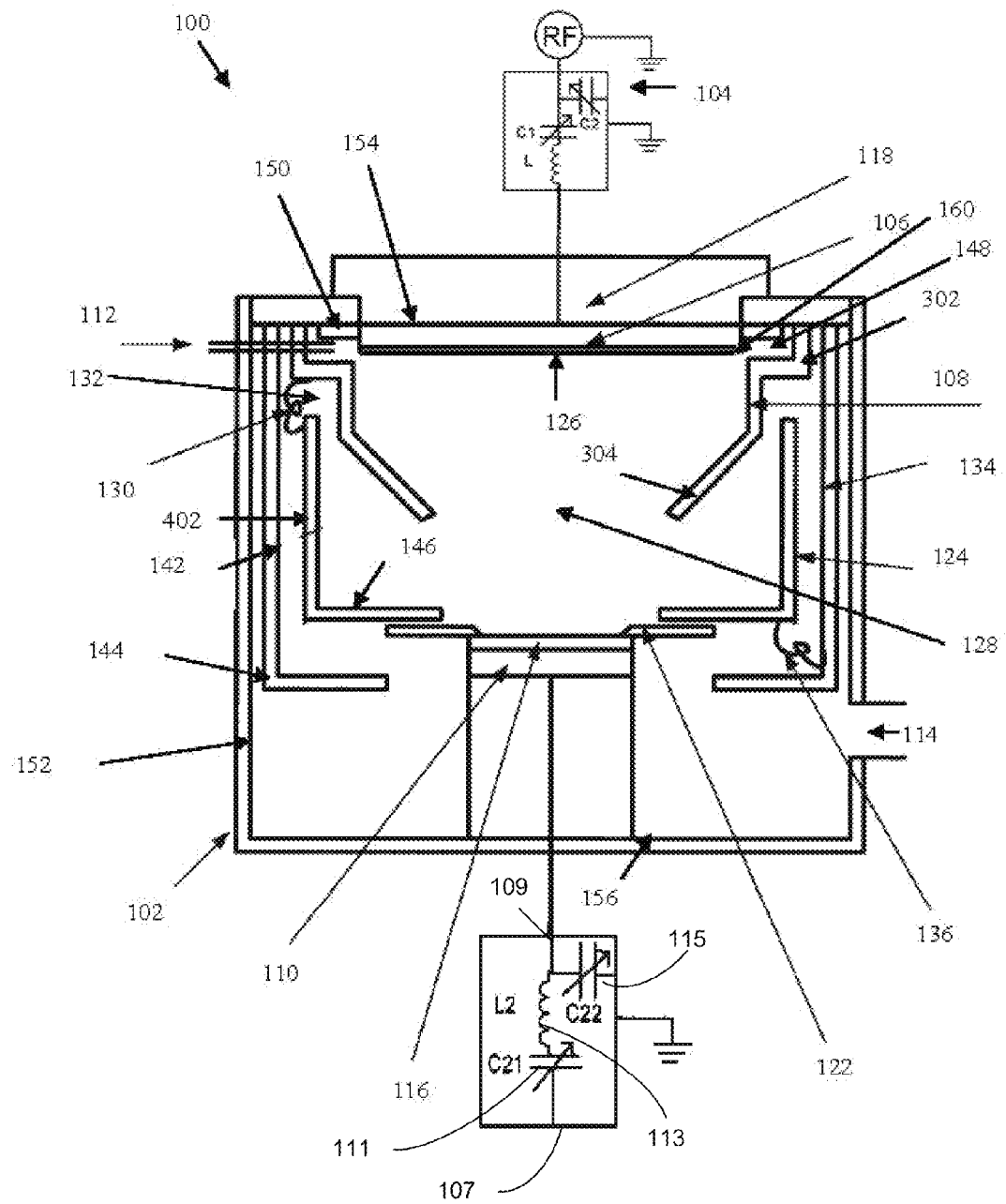
FIG. 1B is a schematic of a cross-section of an embodiment of a physical vapor deposition apparatus including an impedance matching network and an extended anode.

In another embodiment, shown in FIG. 1B, chuck 110 can be electrically isolated or floating from ground, and an impedance matching network 107 can be electrically connected to chuck 110 (the impedance matching network 107 can be connected to ground). No secondary RF power supply is connected to chuck 110. The impedance matching network 107 can include an input terminal 109, a variable tune capacitor 111, an inductor 113, and a shunt capacitor 115. The input terminal 109 can be electrically connected to chuck 110. The variable tune capacitor 111 can be electrically connected to ground. The inductor 113 can be electrically connected between input terminal 109 and shunt capacitor 115. The shunt capacitor 115 can be electrically connected between input terminal 109 and ground and can be in parallel with inductor 113 and variable tune capacitor 111.

An anode 108 can also be housed inside vacuum chamber 102. The anode 108 can provide a counterpart electrode to the cathode 106 so as to provide an RF current return path. In some embodiments, the anode 108 and the chuck 110 can be the same component. In other embodiments, however, as described herein, the anode 108 may be electrically isolated from the chuck 110 so that the chuck 110 can be floating or held at a different potential than the anode 108. The anode can be grounded, i.e., electrically connected in this context (the anode need not be actually connected to ground), to the vacuum chamber sidewalls 152. However, the sidewalls 152 can be grounded.

Figure 1C:
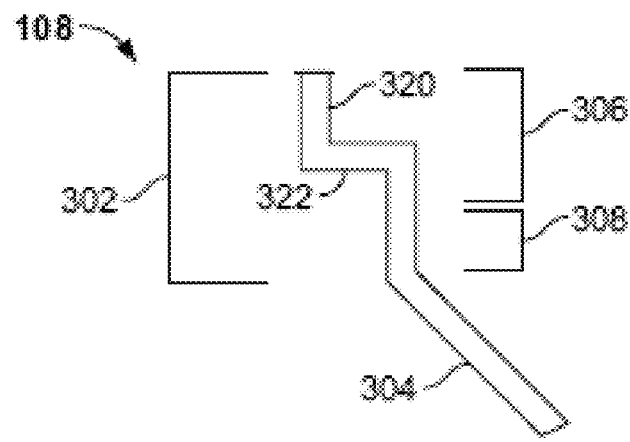
FIG. 1C is an enlarged view of the extended anode of FIG. 1
Figure 2:
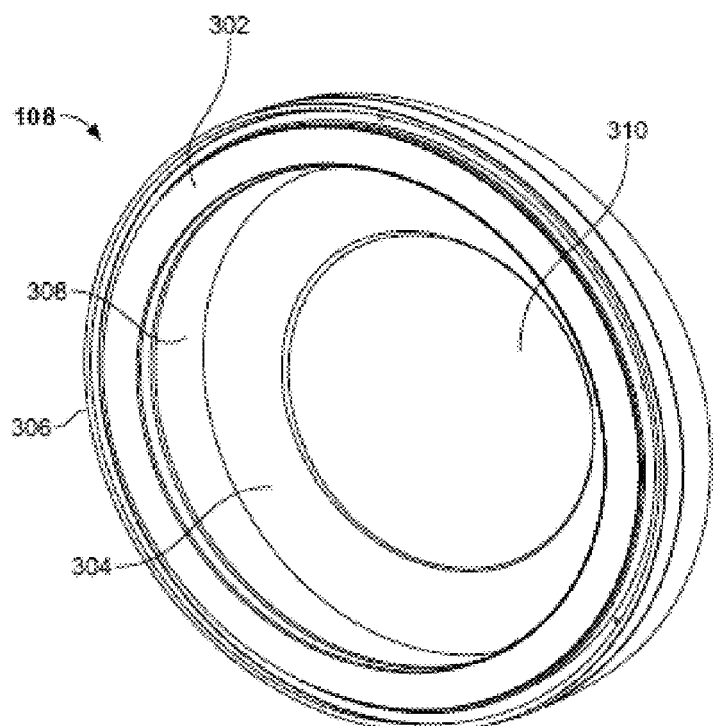
FIG. 2 shows a perspective view of an extended anode for use in a physical vapor deposition apparatus.

Referring to FIGS. 1A, 1B, 1C, and 2, the anode 108 can have an annular body 302 and can be extended by an annular flange 304 projecting inwardly from the annular body 302. The annular flange 304 can define an intended discharge space 128 (see FIG. 1A) in which plasma can be retained during the PVD process. As shown in FIGS. 1C and 2, the annular body 302 can comprise an upper portion 306 and a lower portion 308. The upper portion 306 can be closer to the cathode 106 than the lower portion 308. The spacing 148 (see FIGS. 1A, 1B) between the upper portion 306 and the top surface 154 of vacuum chamber 102 can be configured to prevent plasma formation therebetween.

Shown in FIG. 1C, a top portion 320 of the upper portion 306 of the anode can extend vertically, e.g., it can be a cylinder, from the top surface 154 of the vacuum chamber. The top portion 320 can be parallel to and surround edge 160 of target 126. A bottom portion 322 of the upper portion 306 can extend, e.g. perpendicularly, inwardly from an inside surface at the bottom edge of top portion 320. Bottom portion 322 can extend substantially horizontally inwardly, e.g., as a horizontal ring. The inner radius of the ring 322 can have approximately the same radius as target 126. Lower portion 308 can extend from a lower surface and an inner edge of bottom portion 322. Lower portion 308 can extend perpendicularly from bottom portion 322 and can extend vertically, e.g. as a cylinder. An inside wall of the cylinder can have approximately the same radius as target 126. Although not shown, another projection can extend downwardly from the lower surface of bottom portion 322 near the outside edge such that a gap is formed for the placement of an upper portion of shield 124.

Figure 3A:
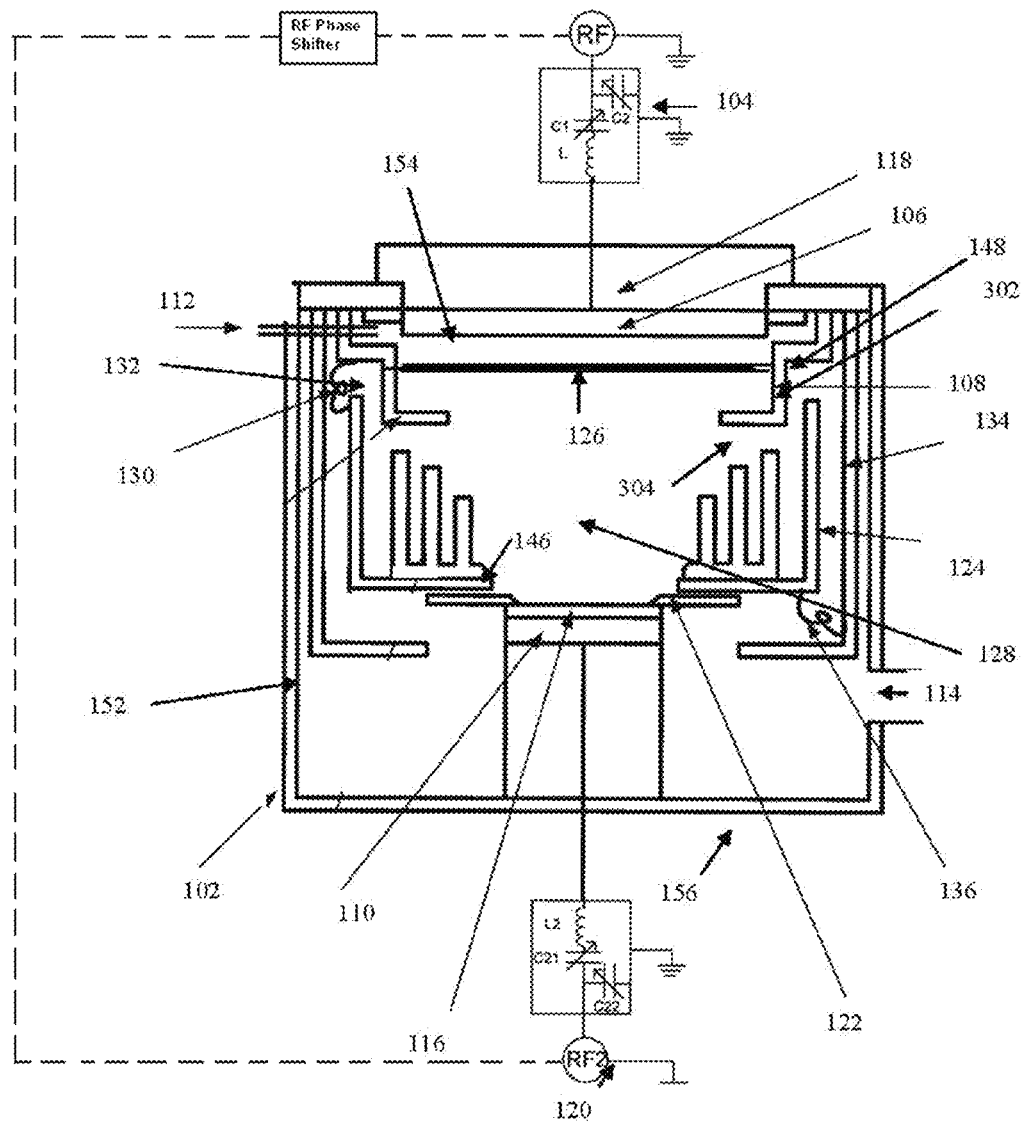
FIG. 3A is a schematic of a cross-section of an embodiment of a physical vapor deposition apparatus including an RF phase shifter and an extended shield.
Figure 3B:
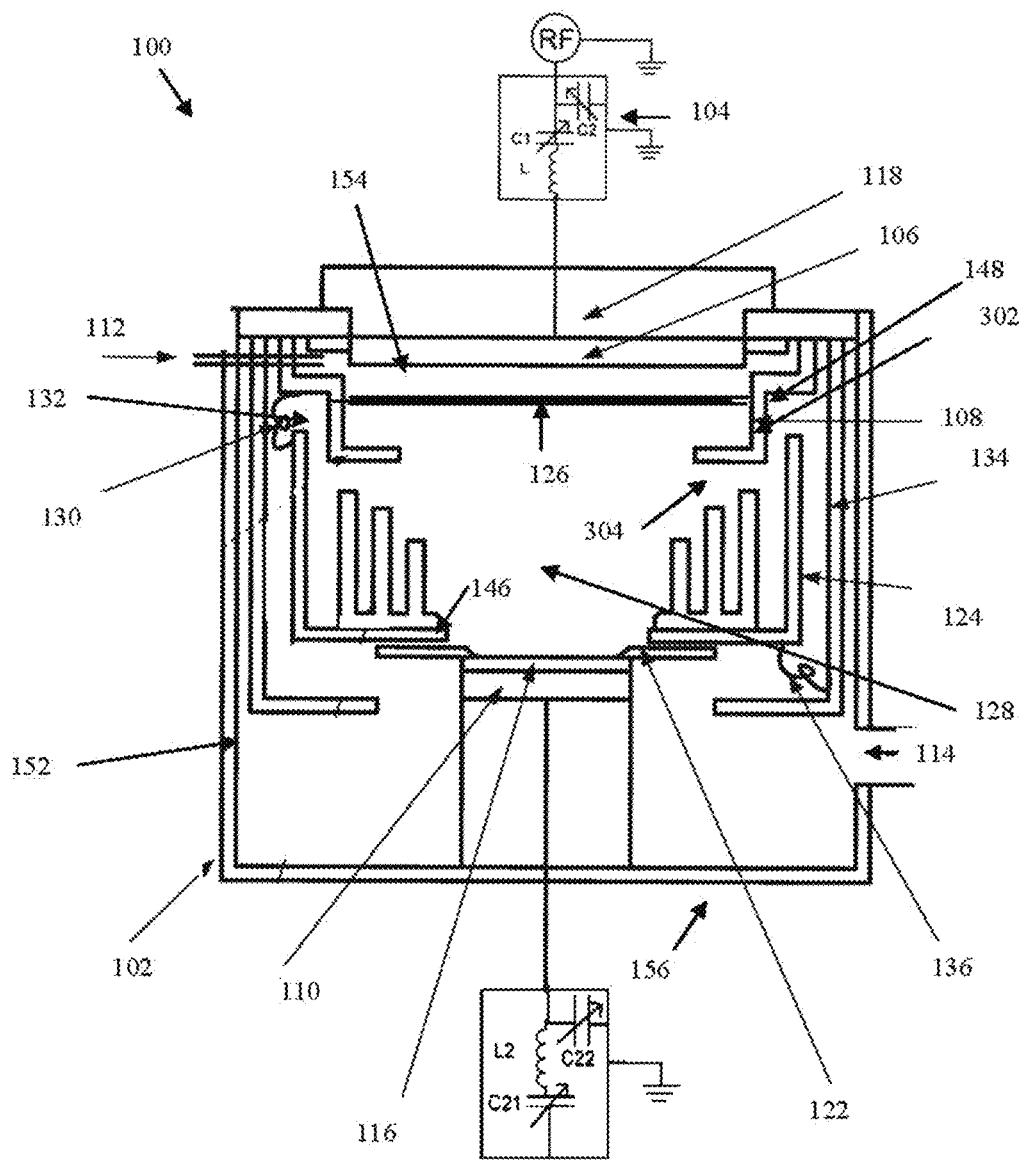
FIG. 3B is a schematic of a cross-section of an embodiment of a physical vapor deposition apparatus including an impedance matching network and an extended shield.
Figure 3C:
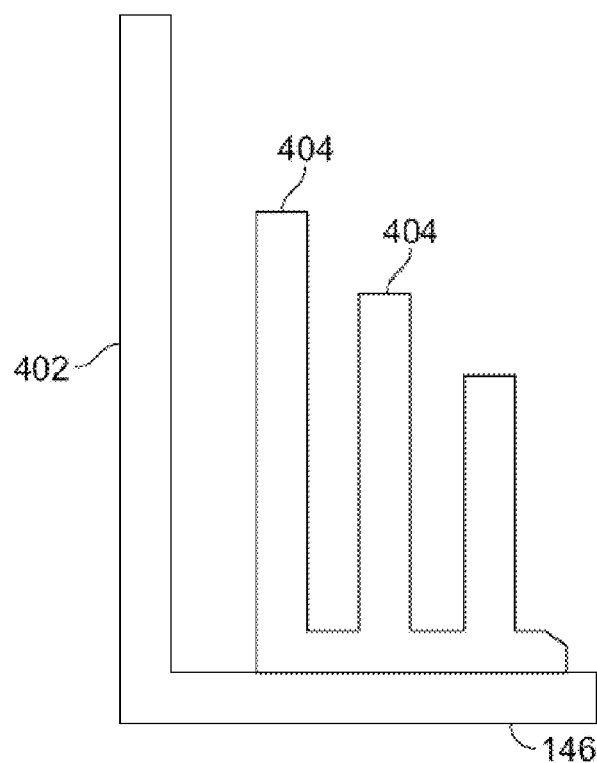
FIG. 3C is an enlarged view of the extended shield of FIG. 3

The annular flange 304 can project inwardly from the lower portion 308 such that at least some of the flange extends below target 126. As shown in FIG. 1A, the flange 304 can extend inwardly and downwardly from the annular body 302 such that the radius of the flange 304 closer to the cathode 106 is larger than the radius of the flange 304 further from the cathode 106, i.e. the flange can have a funnel shape. Alternatively, as shown in FIGS. 3A and 3B, the flange 304 can extend horizontally from the annular body 302. In some embodiments, the flange 304 extends from the lowermost edge of the lower portion 308.

An annular opening 310 (see FIG. 2) can have approximately the same radius as the chuck 110 such that there is no substantial shadowing of the substrate 116 during the PVD process, i.e. such that the entire top surface of substrate 116 can be covered with a thin film.

The vacuum chamber 102 can also include an RF shield 124 to protect the sidewalls of vacuum chamber 102 from being coated with thin film material. The shield 124 can be made, for example, of non-magnetic stainless steel or aluminum and can be grounded to the sidewalls 152 of the vacuum chamber 102.

In some implementations, shown in FIGS. 1A and 1B, the shield 124 can include an annular body 402 that extends vertically, e.g. in a cylindrical shape. A horizontally extending flange 146 can extend inwardly from a bottom edge of the annular body 402. The horizontally extending flange 146 can be located near the bottom of the vacuum chamber 102 and can extend past the flange 304 to surround and partially vertically overlap the lower portion 308 of the anode 108. In some embodiments, the vertically extending flange 146 can extend into a gap between the lower portion 308 of the anode 108 and clamp 122. The flange 146 can partially horizontally overlap the clamp 122.

Figure 4:
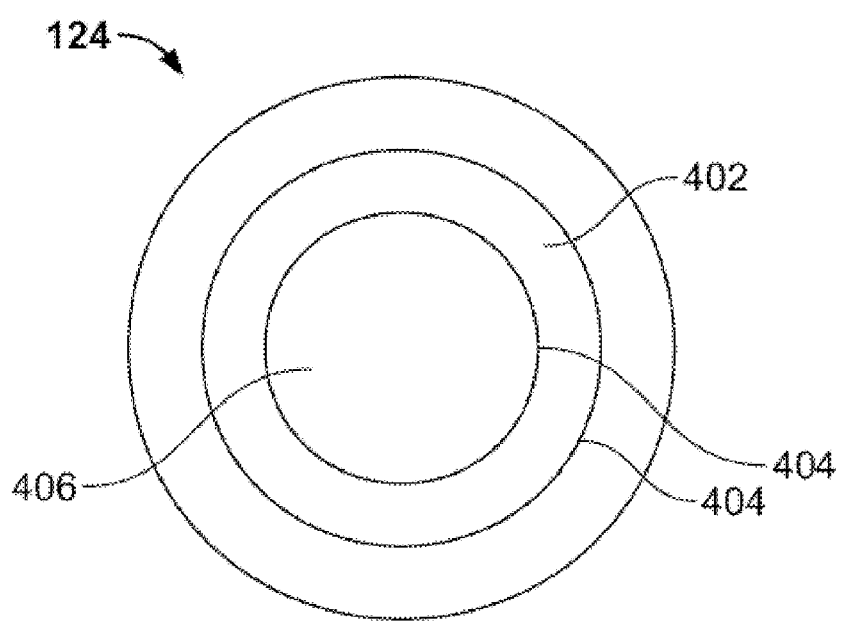
FIG. 4 is a schematic view of the top of an extended shield for use in a physical vapor deposition apparatus.

The annular opening 406 (see FIG. 4) inside the annular flange 146 of the shield 124 can have approximately the same radius as the chuck such that there is no substantial shadowing of the substrate 116. A gap 132 can exist between the shield 124 and the anode 108 in order to permit process gas to be evacuated from the intended discharge space 128.

In some embodiments, shown in FIGS. 3A, 3B, 3C, and 4, the shield can be extended such that a set of concentric annular projections 404 projects from the annular flange 146, for example towards the cathode 106. The annular projections 404 can extend parallel to annular body 402. As shown in FIGS. 3A and 3B, the height of the annular projections 404 can increase along a radius from the center of the vacuum chamber 102 to the sidewalls 152. The annular body 402 can have a height that is taller than the height of the annular projections 404.

The physical vapor deposition apparatus 102 can further include an electrically conductive body 130, for example a strap, that directly connects the anode 108 and the shield 124. The electrically conductive body 130 can be flexible and can be configured to permit gas flow between the anode 108 and shield 124. For example, the electrically conductive body 130 can be a mesh or a wire strap. The electrically conductive body 130 can be made, for example, of copper or aluminum.

There can be a number of connections between the anode 108 and shield 124. For example, the electrically conductive body 130 can be connected to the anode 108 and the shield 124 at least four points. The electrically conductive body 130 can be connected between a lower surface of the anode 108 and a top portion of the shield 124. The electrically conductive body 130 can also be connected between a top portion of the anode 108 and an outer surface of the shield 124.

The physical vapor deposition apparatus 100 can further include a secondary chamber shield 134. The chamber shield can be made of, for example, non-magnetic stainless steel or aluminum. An upper portion of the chamber shield can be positioned between the anode 108 and the sidewalls of the vacuum chamber 102. A lower portion of the chamber shield 134 can be positioned between the sidewalls of the vacuum chamber 102 and shield 124. The chamber shield 134 can be concentric with and surround shield 124 and/or anode 108. The height of the chamber shield 134 can be equal to or greater than the height of shield 124. The chamber shield 134 can include a vertical annular body 142 and an annular flange 144 extending inwardly from the annular body 142, e.g., from the lower edge of the vertical annular body 142. The annular flange 144 of the chamber shield 134 can extend below the annular flange 146 of shield 124, but can have a radial length that is shorter than the annular flange 146. The annular flange 144 can be closer to the bottom of the chamber than the chuck 110. The inner edge of the flange 144 of the chamber shield can be vertically aligned with the outer edge of the chuck 110.

The chamber shield 130 can be configured such that process gases may still be pumped into and out of the vacuum chamber 102. For example, the chamber shield 134 may be short enough so as not to cover the gas inlet 142 or the vacuum inlet 114. Alternatively, the chamber shield 134 may have holes (not shown) in locations corresponding to the locations of gas inlet 142 and vacuum inlet 114. Furthermore, the chamber shield 134 can be separately removable and can be cleaned easily and reused over time.

The chamber shield 134 can be electrically bonded to shield 124 with an electrically conductive body 136. The electrically conductive body 136 can be of similar material and shape as electrically conductive body 130. Thus, the electrically conductive body 136 can be configured to permit gas flow between shield 124 and chamber shield 134. Likewise, the electrically conductive body 136 can be composed of mesh, can be one or more strap, and can comprise copper or aluminum. Moreover, the electrically conductive body 136 can be connected between a bottom surface of shield 124 and an inner surface of chamber shield 134.

The physical vapor deposition apparatus 100 can further include a process gas inlet 112, process gas control devices (not shown), a vacuum inlet 114, pressure measurement and control devices (not shown), and vacuum pumps (not shown).

During the sputtering or PVD process, gases, such as argon and oxygen, are supplied through the gas inlet 112 at a flow rate of 10-200 sccm/0.2 to 4 sccm, such as 10 to 60 sccm/0.5 to 2 sccm. A vacuum pump (not shown) maintains a base vacuum, for example, of $10^{-7}$ Torr or below, and a plasma operation pressure, for example, of 0.5 mTorr to 20 mTorr, particularly 4 mTorr, through vacuum inlet 114. When the RF power from RF power supply 104 is applied on the order of 500 W to 5,000 W, for example 2000 W to 4,000 W, or 3000 W, to the cathode assembly 106, the target 126 is negatively biased and the anode 108 is positively biased, causing plasma to form in the intended discharge space 128 between the cathode 104 and the anode 108. The magnetron assembly 118 creates a magnetic field of, for example, 50 Gauss to 400 Gauss, such as 200 Gauss to 300 Gauss, at and near the front surface of the cathode 106. The magnetic field confines the electrons to a helical motion parallel to the front surface of target 126.

The negative self bias DC voltage on target 126, in conjunction with the electrons confined near the surface of target 126 by the magnetic field, facilitates bombardment of the target 126 by energetic positive ions of the plasma. Momentum transfer causes neutral target material, such as PZT molecules, to dislocate from the target 126 and deposit on substrate 116, creating a thin film on substrate 116. The resulting thin film can have a thickness of 2000 Å to 10 μm, for example 2-4 μm.

Figure 5:
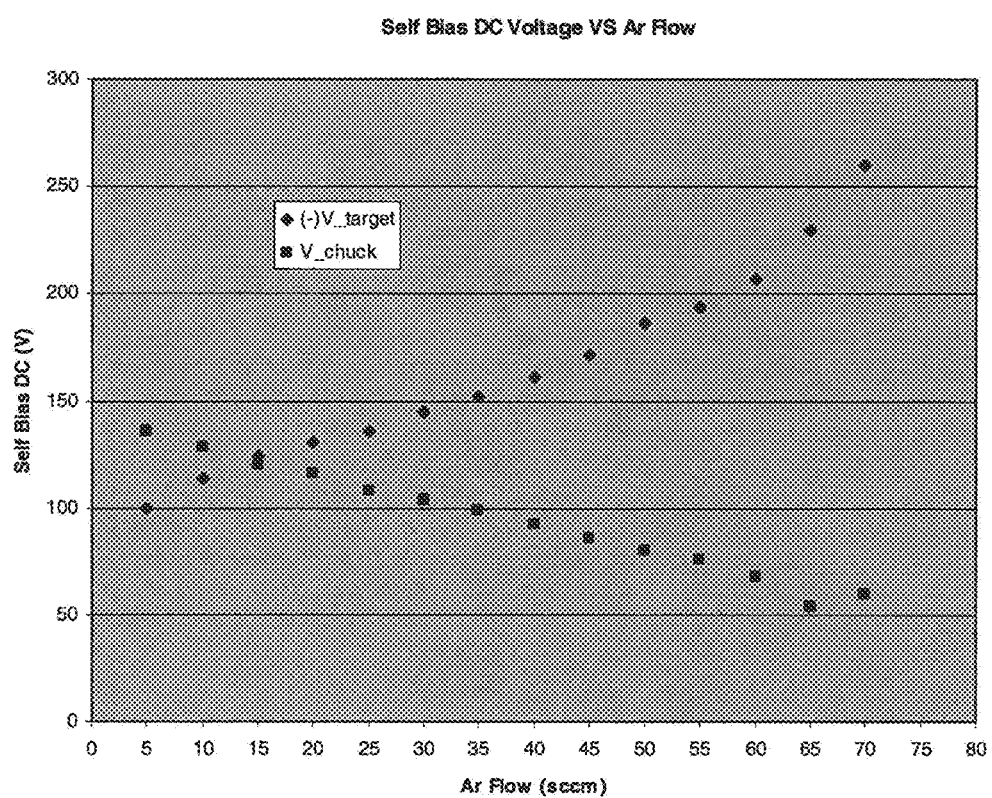
FIG. 5 is an example graph of self bias DC voltage vs. argon flow for a chuck and a cathode.

In the embodiment shown in FIGS. 1A and 3A, when RF power supply 120 is applied to substrate 116, a DC self bias can develop on the substrate. RF Phase shifter 105 can be used to adjust the phases, e.g. the current or voltage phase, of the RF signal applied by RF power supply 104 and/or RF power supply 120. The RF phase shifter 105 can lock the respective phases such that the difference in phase, e.g. from 0° to 369°, creates the desired DC self bias on the substrate, which can have a negative, positive, or zero charge, for example −300V to +300V, in particular −100V to +100V. As an example, a graph of a positive self bias of a substrate vs. gas flow is shown in FIG. 5.

The charge of the DC self bias can be controlled by the amount of RF power applied to substrate 116 in addition to the difference in phase. If low RF power, e.g. less than 50 W, such as less than 2 W, is applied to chuck 110, and the phase is locked, e.g., between 190° and 240°, such as 220°, a time-average positive DC self bias, e.g. of 10V-100V, such as 60V, can develop on substrate 116. A positive voltage results in attracting and accelerating electrons from the plasma to the surface of substrate 116. Those electrons with sufficient energies will cause modification of the sputtered material properties without causing any substantial re-sputtering due to their low momentum. Moreover, a positive voltage can prevent plasma ions from bombarding the surface of substrate 116 and thus avoid etching of the surface. In contrast, if a higher RF power is applied to the substrate, e.g. greater than 50 W, and the phase is locked at, for example, below 190° or above 240°, such as below 180° or above 270°, a negative DC self bias can develop on substrate 116. A negative voltage can cause plasma ions to be attracted and accelerated towards the substrate, which can result in re-sputtering of the surface. Re-sputtering can be useful, for example, for etching the substrate surface. For a given implementation, such as chamber configuration, gas composition and flow rate, pressure, magnetic field, and voltage, experimentation may be required to obtain the phase shift necessary to generate a positive or negative self bias voltage.

Figure 6:
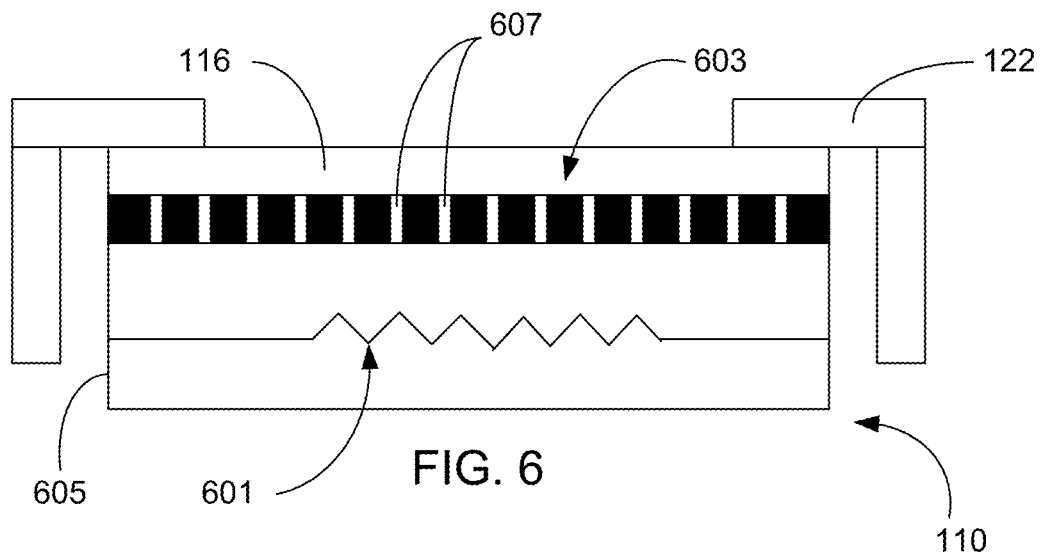
FIG. 6 is a schematic of a cross-section of a physical vapor deposition apparatus chuck including a heater diffuser.
Figure 7:
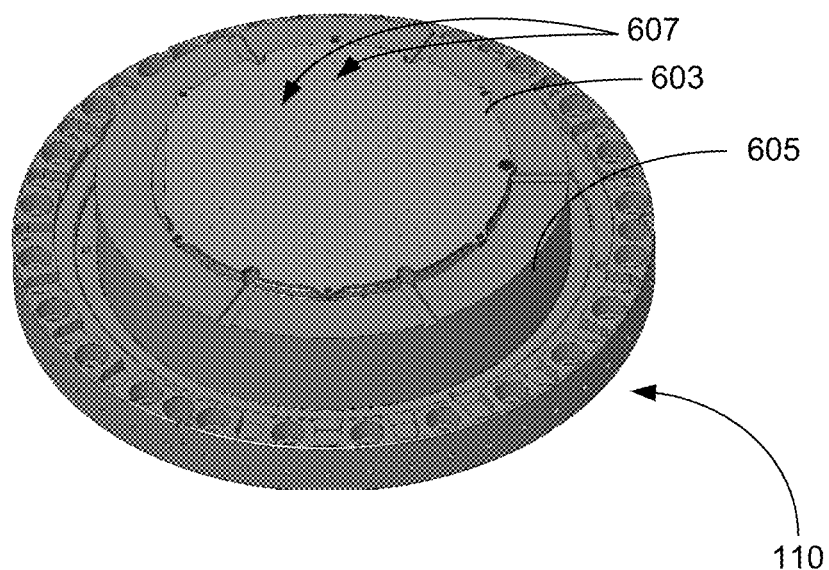
FIG. 7 is a perspective view of a heat diffuser for use in a physical vapor deposition apparatus.

In some implementations, referring to FIGS. 6 and 7, the chuck 110 includes a chuck body 605 and a heater 601. The chuck body can be made, for example, of a metal alloy, such as a steel-like alloy, e.g., an alloy with Nickel. The heater 601 can be embedded in the chuck body 605 and can be, for example, a resistive heater. In other implementations, the heater can be outside the chuck body and can be, for example, an infrared heater, or be a resistive heater attached to the chuck body 605. Electrical leads through a support that holds the chuck 110 can connect the heater to a power source. The heater can be configured to maintain the temperature of substrate 116 at a prescribed temperature between 25° C. and 800° C. For example, the chuck 110 can be maintained at a temperature such as 650° C. to 700° C. (which is a temperature at the substrate achieves an actual temperature of 500° C. to 600° C.).

The chuck 110 can further include a heat diffuser 603 supported on the chuck body 605. A top surface of the heat diffuser 603, i.e., the surface supporting the substrate 116, can be substantially planar and smooth, e.g., a surface roughness RA less than about 50 µm. During the deposition process the substrate 116 can rest on top of the heat diffuser 603. Thus, the bottom surface of the substrate 116 can contact the top surface of the heat diffuser 603. The heat diffuser can be, for example, about 1 mm to 5 mm thick, e.g., 2 mm thick.

The heat diffuser can be a disk-shaped body, and can consist of a substantially homogenous material. The heat diffuser 603 can be made of an electrically conductive material, e.g. graphite, such that the heat diffuser can be electrically connected with the RF power supply or impedance matching network. Moreover, using graphite for the heat diffuser 603 can be advantageous over, for example, copper, because it is more resistant to heat deformation.

The heater diffuser 603 can include passages 607 through the heat diffuser 603. The passages 607 can extend perpendicular to the top surface. The passages 607 can be between about 100 µm and 1,000 µm in diameter, such as about 500 µm in diameter. The passages can be distributed uniformly across the diffuser, e.g., with a spacing or pitch of about 10 to 15 mm. Thus, the heat diffuser 603 can include 50 or more passages, e.g., 50 to 200. The passages 603 can extend, for example, vertically through the heat diffuser 603. In some implementations, the passages 607 are machined into the body of the heat diffuser, e.g., by drilling. The passages 607 can be substantially linear and parallel to each other. However, in some implementations, the heat diffuser does not include any passages therethrough.

In some implementations, the passages 607 are formed from the natural graphite structure. That is, the passages 607 are not engineered into the heat diffuser, but rather are formed as part of the graphite itself. Such passages can be less than 1,000 µm and may not be straight and parallel with each other, but are still configured such that gas can flow therethrough.

During the sputtering or PVD process, the substrate 116 can be placed on top of the heat diffuser 603 such that as much contact as possible is made with the diffuser. The heater 601 can be activated to heat the substrate 116. A heat transfer fluid, e.g., a gas, such as argon or helium or a combination thereof, can flow through the passages 607 towards the substrate 116. Such flow of gas can improve the heat conductivity of the heat diffuser 603. Further, using a material such as graphite for the heat diffuser 603 can be advantageous because graphite has a high infrared absorptivity and emissivity, allowing the substrate 116 to be heated uniformly. Allowing the substrate 116 to directly contact the graphite of the heat diffuser 603 allows for better heat transfer between the heat diffuser 603 and the substrate 116. In addition, because the top surface of the heat diffuser 603 is not perfectly flat but has some surface roughness, the heat transfer gas can flow into spaces between the heat diffuser 603 and the substrate 116. As a result, while temperature variations of the chuck 110 can be quite high, such as around 30° C., the temperature variations across the substrate can be about 15-20° C. when the heat diffuser 603 without passages is used, or less than 10° C., such as 6-10° C., when the heat diffuser 603 with passages is used.

Figure 8:
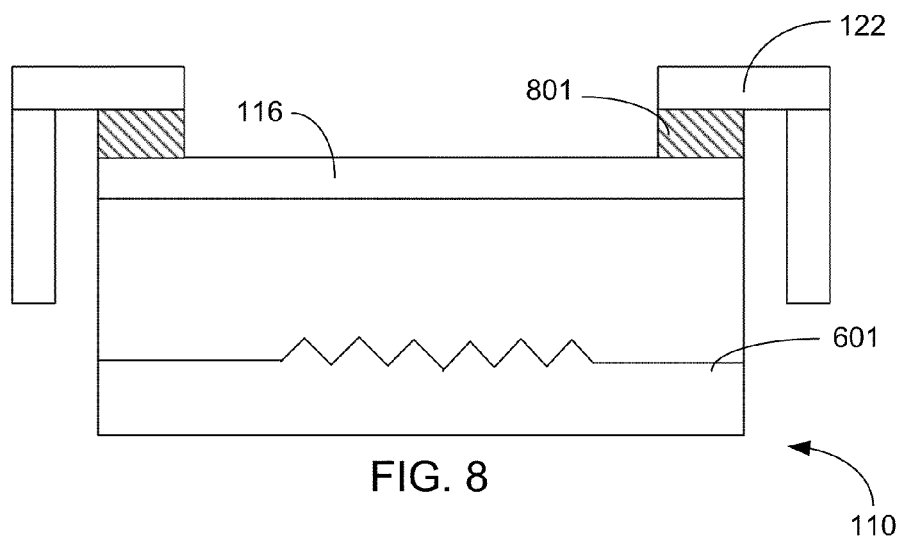
FIG. 8 is a schematic of a cross-section of a physical vapor deposition apparatus including an insulator between the chuck and the clamp.

In some implementations, referring to FIG. 8, an insulator 801 can be located between the substrate 116 and the clamp 122. The insulator 801 can be annular in shape, e.g., a ring. The insulator 801 can be, for example, quartz, alumina ceramic, or fluorphlogopite mica (e.g., Macor®), or another material at least as electrically insulative. The insulator 801 can be about 1 mm to 2 mm thick. As a ring, the width between the inner and outer diameter of the insulator ring can be a few mm to a few cm, e.g., 25 mm.

Electrical contact at a limited number of contact points between the conductive clamp 122 and the substrate 116 can cause deformities in the resulting film. For example, if there are only a limited number of contact points, RF current can be concentrated in the substrate at these contact points. The concentrated RF current can heat the film, causing burning, nonuniformity of thickness, and formation of particles in the film. However, the insulator 801 can advantageously isolate the clamp 122 from the substrate 116, eliminating discharge between the clamp 122 and the substrate 116 that can negatively effect the properties of the deposited thin film.

Further, using the insulator 801 can be advantageous in forming a film having a substantially pure (111) crystalline structure. Such a substantially pure (111) crystalline structure can be formed, for example, by including the insulator 801 and heating the chuck to between about 650° C. and 750° C. during the PVD process. The substantially pure (111) crystalline film can have advantageous dielectric and piezoelectric properties, such as a high d33 coefficient and high dielectric breakdown voltages.

As noted above, if there are only a limited number of electrical contact points between the substrate and a conductive clamp ring, RF current can be concentrated in the substrate at these contact points. This effect can occur even if the bottom surface of the clamp ring appears planar (e.g., on unaided visual inspection). Without being limited to any particular theory, this may be because the clamp ring can have some small machining tolerance or surface roughness when manufactured, and if the conductive clamp ring rests on the substrate, it makes physical contact with the substrate in only a limited number of locations corresponding to high points on the clamp ring. In order to address this issue, in some implementations, the system can be configured to independently press multiple electrodes into contact with the substrate.

Figure 9A:
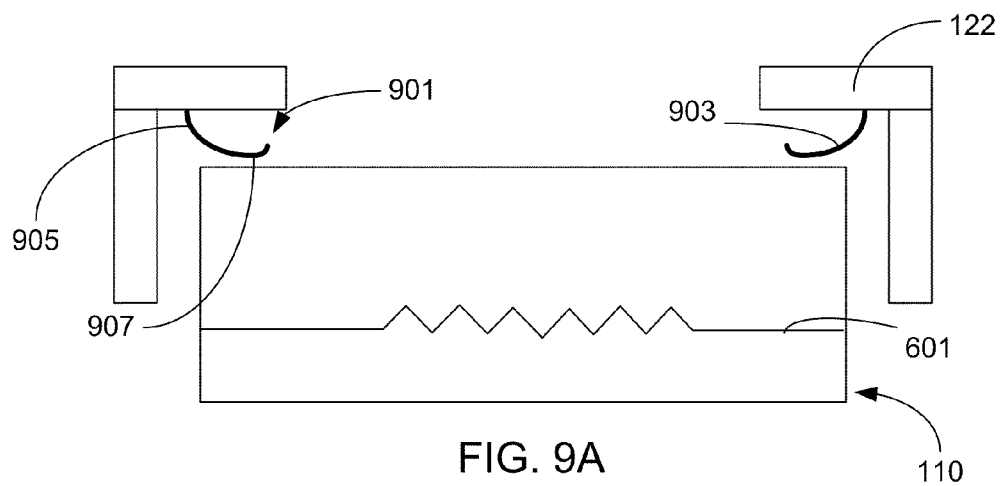
FIG. 9A is a schematic of a cross-section of a physical vapor deposition apparatus including a spring system having a plurality of un-compressed springs between the chuck and the clamp.
Figure 9B:
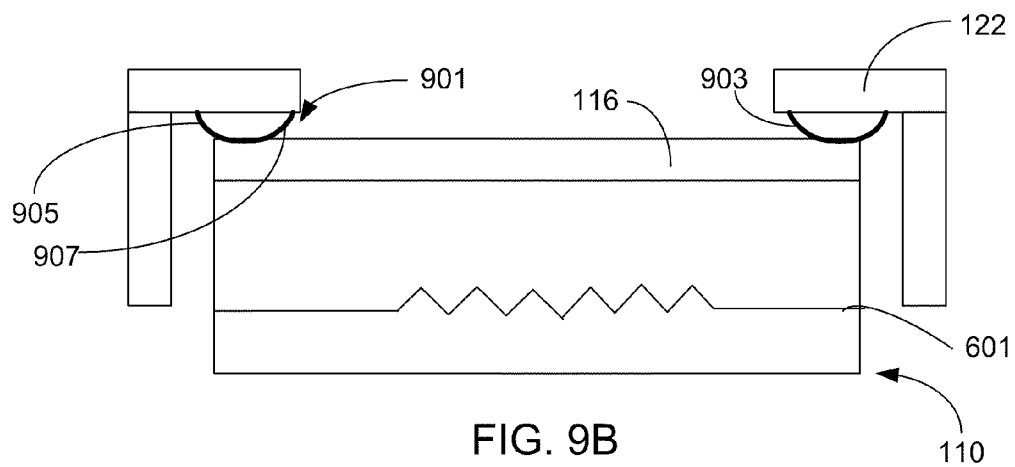
FIG. 9B is a schematic of a cross-section of a physical vapor deposition apparatus including a spring system having a plurality of compressed springs between the chuck and the clamp.
Figure 10:
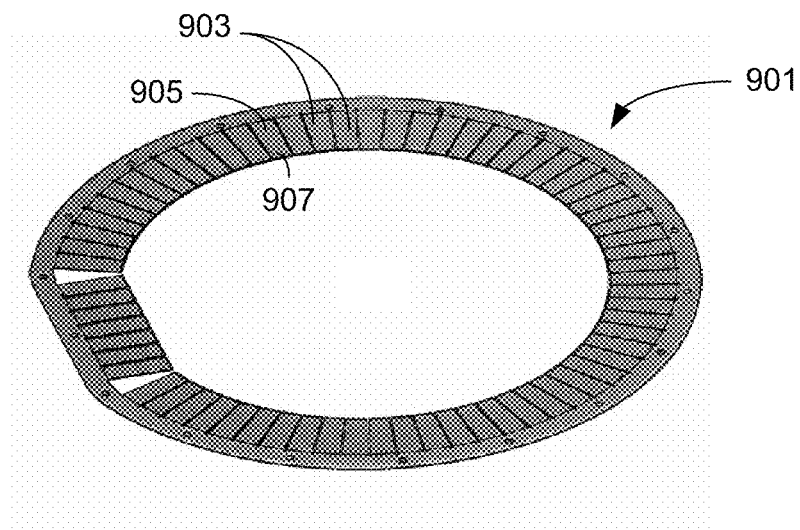
FIG. 10 is a perspective view of a spring system of a physical vapor deposition apparatus.

Referring to FIGS. 9A, 9B, and 10, a multi-point electrical contact system 901 is located between the clamp 122 and the substrate 116. The multi-point electrical contact system 901 includes a plurality of independently vertically movable conductive electrodes, for example, 10-100 electrodes. Each electrode is electrically connected to the clamp 122. In some implementations, the electrodes are positioned around the perimeter of the chuck 110 such that when the substrate is positioned on the chuck, the electrodes contact the top surface of the substrate near the perimeter of the substrate. Each electrode is independently urged, e.g., by a spring, toward the chuck 110. The springs can be evenly spaced, i.e., at uniform angular intervals, around the clamp 122.

In some implementations, the electrodes are themselves springs, and the multi-point electrical contact system 901 can be considered a spring system. The spring system 901 can include conductive springs 903 spaced around the clamp 122. The spring system 901 can include, for example, 10-100 springs, such as 64 springs. The springs can be evenly spaced, i.e., at uniform angular intervals, around the clamp 122. The springs 903 can be made of a metal alloy that has a substantially constant spring constant at temperatures between 300° C. and 600° C. For example, the springs can be a nickel-chromium alloy, e.g., Inconel X750.

Each of the springs 903 can be, for example, a flat or leaf spring. A first end 905 of each spring 903 can be attached to the clamp 122. As shown in FIG. 9A, each spring 903 can extend inwardly from the first end 905 towards a center of the annular clamp 122. In addition, each spring 903 can be angled downwardly slightly, relative to the plane of the clamp 122, such that the ends of the springs, e.g., the inner ends, are closer to the chuck.

Further, the spring system 901 can be configured such that, as shown in FIG. 9A, when a substrate is not sitting on the chuck 110, the springs 903 are fully expanded and the loose end 907 of each spring 903 does not touch the clamp 122. However, as shown in FIG. 9B, when a substrate 116 is placed on the chuck 110, and the clamp 122 is lowered close to the substrate 116, the springs 903 can compress, moving the loose end 907 towards the clamp 122. The spring system 901 can be configured, e.g., by having the loose end 907 of the spring curve back upwards toward the chuck, such that when holding the substrate 116 on the chuck, at least some of the loose ends 907 of the springs 901 compress enough to touch the clamp 122. Each spring 903 can compress vertically by less than 0.5 mm.

Each of the springs 903 can provide an electrical connection between the clamp 122 and the substrate 116. By including more electrical contacts between the substrate 116 and clamp 122, the electrical currents through the substrate can be dispersed across a greater area of the substrate, reducing current concentrations and reducing the likelihood of defects and resulting in a more homogeneous film.

Further, using spring system 901 can be advantageous in forming a film having a substantially pure (100) crystalline structure. Such a substantially pure (100) crystalline structure can be formed, for example, by including the spring system 901 and heating the chuck to between about 670° C. and 690° C. during the PVD process. The substantially pure (100) crystalline film can have advantageous dielectric and piezoelectric properties, such as a dielectric constant in the range of 1000 to 1700, a high d31 coefficient, and a high break-down voltage. For example, PZT thin films having a (100) crystal orientation can be used as MEMS devices, such as actuators for ink dispensing devices.

Finally, using a spring system 901 can be advantageous because it can help seal the substrate 116 onto the chuck 110. That is, having multiple contact points between the clamp 122 and the substrate 116 can improve the clamping force of the substrate 116 to the chuck 110. Such improved sealing can prevent gas, e.g., gas circulated through a heat diffuser as discussed above, from leaking out the sides of the chuck 110.

Although in the implementation discussed above the springs serve as the electrodes, it is also possible for the springs to be separate components that urge electrodes into contact with the substrate.

A number of embodiments have been described. Nevertheless, it will be understood that various modifications may be made without departing from the spirit and scope of what is described. For example, it should be understood that terms of positioning and orientation (e.g., top, vertical) have been used to describe the relative positioning and orientation of components within the physical vapor deposition apparatus, but the physical vapor deposition apparatus itself can be held in a vertical or horizontal orientation or some other orientation. Accordingly, other embodiments are within the scope of the following claims.

What is claimed is:

1. A physical vapor deposition apparatus comprising:
   a vacuum chamber having side walls;
   a cathode inside the vacuum chamber, wherein the cathode is configured to include a sputtering target;
   a radio frequency power supply configured to apply power to the cathode;
   an anode inside and electrically connected to the side walls of the vacuum chamber;
   a chuck inside and electrically isolated from the side walls of the vacuum chamber, the chuck configured to support a substrate, the chuck comprising a body formed of a metal alloy and a disk-shaped graphite heat diffuser supported on the body, the disk-shaped graphite heat diffuser having a substantially planar top surface configured to contact the substrate and a parallel bottom surface in contact with an upper surface of the body formed of the metal alloy, and the heater diffuser including a plurality of passages therethrough, the passages being between about 0.0044% and 1% of the surface area of the substantially planar top surface; and
   a heater to heat the substrate supported on the chuck, the heater comprising a resistive heater embedded in the body of the chuck to provide heat to the substrate supported by the chuck through at least a flow in the plurality of passages of the heat diffuser that carries heat from the resistive heater to at least a portion of space between the graphite heat diffuser and the substrate such that heat is conducted through the graphite heat diffuser to the substrate.

2. The physical vapor deposition apparatus of claim 1, wherein each of the passages extends vertically through the heat diffuser.

3. The physical vapor deposition apparatus of claim 1, wherein each of the passages is between about 100 and 1,000 µm in diameter.

4. The physical vapor deposition apparatus of claim 3, wherein each of the passages is about 500 µm in diameter.

5. The physical vapor deposition apparatus of claim 1, wherein the passages have a spacing of about 10 to 15 mm.

6. The physical vapor deposition apparatus of claim 1, wherein the heat diffuser is between about 1 mm and 5 mm thick.

7. The physical vapor deposition apparatus of claim 6, wherein the heat diffuser is about 2 mm thick.

8. The physical vapor deposition apparatus of claim 1, wherein a top surface of the heat diffuser is substantially planar.

9. The physical vapor deposition apparatus of claim 8, wherein the heat diffuser is configured such that a bottom surface of the substrate is substantially flush with the top surface of the heat diffuser.

10. The physical vapor deposition apparatus of claim 1, wherein the target comprises a dielectric material.

11. The physical vapor deposition apparatus of claim 10, wherein the material comprises lead zirconate titinate ("PZT").

12. The physical vapor deposition apparatus of claim 1, further comprising an impedance matching network electrically connected to the chuck.

13. A method of physical vapor deposition comprising:
applying a radio frequency signal to a cathode in a physical vapor deposition apparatus, wherein the cathode includes a sputtering target;
supporting a substrate on a chuck, the chuck comprising a body formed of a metal alloy and a disk-shaped graphite heat diffuser supported on the body, the disk-shaped graphite heat diffuser having a substantially planar top surface and a parallel bottom surface in contact with an upper surface of the body formed of the metal alloy;
contacting the substrate to the substantially planar top surface of the disk-shaped graphite heat diffuser located between the chuck and the substrate while heating the substrate, the graphite heat diffuser including a plurality of gas passages therethrough, the passages being between about 0.0044% and 1% of the surface area of the substantially planar top surface;
heating the substrate using a resistive heater embedded in the body of the chuck through the graphite heat diffuser, the substrate being heated by at least a flow in the plurality of passages of the heat diffuser that carries heat from the resistive heater to at least a portion of space between the graphite heat diffuser and the substrate; and
depositing a material from the sputtering target onto the substrate.

14. The method of claim 13, wherein a temperature across the heated substrate varies by less than 10° C.

15. The method of claim 13, wherein the radio frequency signal has a radio frequency power having a magnitude of between about 1000 W and 5000 W.

16. The method of claim 13 wherein the radio frequency power is about 3000 W.

17. The method of claim 13 wherein the target comprises a dielectric material.

18. The method of claim 17 wherein the dielectric material comprises lead zirconate titinate ("PZT").

19. The method of claim 13, wherein deposited material forms a film on the substrate, the film having a thickness of between about 2000 Å and 10 μm.

20. The method of claim 19, wherein the thickness is between about 2 μm and 4 μm.

* * * * *

UNITED STATES PATENT AND TRADEMARK OFFICE
CERTIFICATE OF CORRECTION

PATENT NO.         : 9,181,619 B2
APPLICATION NO.    : 12/714422
DATED              : November 10, 2015
INVENTOR(S)        : Youming Li and Jeffrey Birkmeyer Page 1 of 1

It is certified that error appears in the above-identified patent and that said Letters Patent is hereby corrected as shown below:

In the claims

Col. 13, line 16, claim 11, delete "titinate" and insert -- titanate --

Col. 14, line 25, claim 18, delete "titinate" and insert -- titanate --

Signed and Sealed this
Twenty-third Day of February, 2016

Michelle K. Lee
*Director of the United States Patent and Trademark Office*